United States Patent [19]

Dillow

[11] 4,150,991

[45] Apr. 24, 1979

[54] METHODS FOR PROVIDING TRANSPARENT ORIGINALS FOR PRINTING PLATE PRODUCTION OR FOR DIRECT PRODUCTION OF PRINTING PLATE

[75] Inventor: Brian St. P. Dillow, Stockholm, Sweden

[73] Assignee: Misomex Aktiebolag, Hägersten, Sweden

[21] Appl. No.: 652,168

[22] Filed: Jan. 26, 1976

[30] Foreign Application Priority Data

Apr. 30, 1975 [SE] Sweden .............................. 7505084

[51] Int. Cl.² .......................... G03C 5/04; G03C 5/06
[52] U.S. Cl. ..................................... 96/41; 96/27 R;
    96/27 E; 96/44; 355/40; 355/46; 355/56;
    355/77
[58] Field of Search .................... 96/27 R, 27 E, 36.1,
    96/41, 42, 43, 44; 355/39, 40, 46, 53, 77, 55, 56

[56] References Cited

U.S. PATENT DOCUMENTS

| 2,153,212 | 4/1939 | Spray | 355/39 |
|---|---|---|---|
| 3,639,059 | 2/1972 | Staumor et al. | 355/53 |
| 3,667,364 | 6/1972 | Mann | 355/53 |
| 3,682,540 | 8/1972 | Oxberry et al. | 355/18 |

OTHER PUBLICATIONS

J. W. Burden, "Graphic Reproduction Photography", 4-74, pp. 399-402.

Primary Examiner—Edward C. Kimlin
Attorney, Agent, or Firm—Larson, Taylor and Hinds

[57] ABSTRACT

Methods are described for the preparation of a light sensitive collection surface for use in directly or indirectly printing copies on which text and images are arranged according to a predetermined layout. The methods include the steps of preparing first and second surfaces on which reproducible text and images, respectively, are arranged; defining the respective locations and sizes of the image areas provided in the layout with at least two pairs of first position coordinates and defining the respective locations of the reproducible images with at least one pair of second position coordinates; positioning the image bearing surface with respect to the collection surface by calculating the coordinate relationship between the corresponding ones of the first and second position coordinates so as to align at least one of the reproducible images with the unexposed area provided therefor on the collection surface; and exposing the aligned reproducible image(s) onto the collection surface with a sharply defined light beam which is automatically sized in dependence on the corresponding pairs of the first position coordinates so as to fall within the area(s) of the collection surface intended for the aligned reproducible image(s).

6 Claims, 7 Drawing Figures

FIG. 1
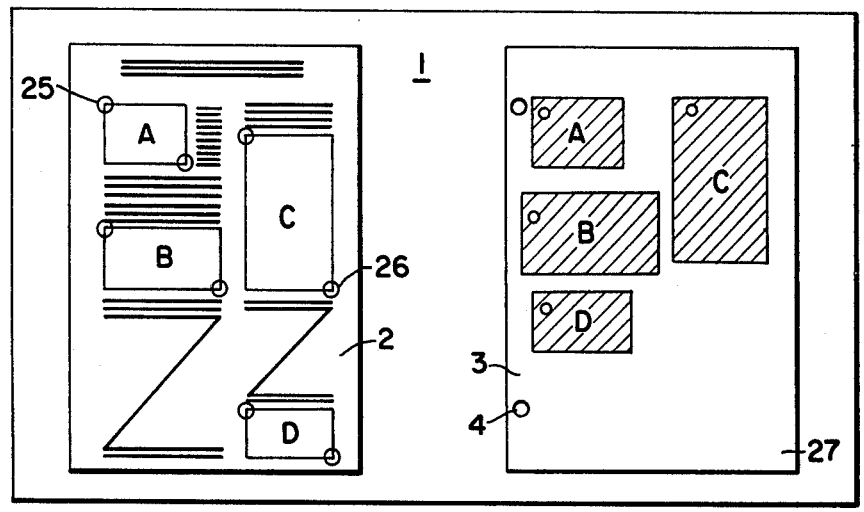
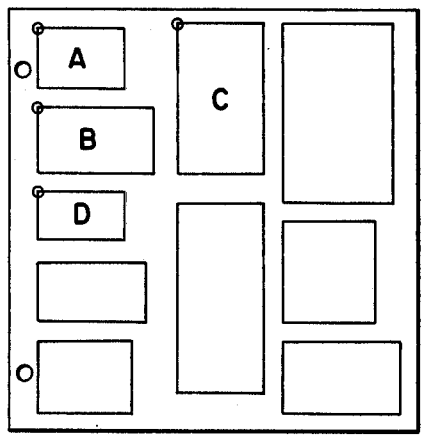
FIG. 2
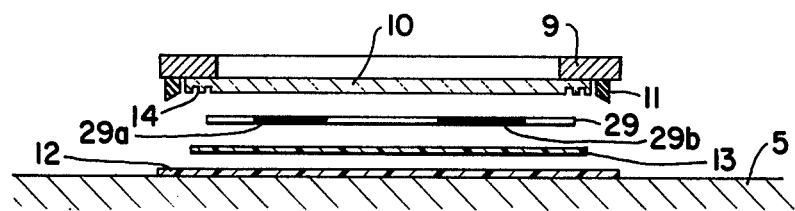
FIG. 4

METHODS FOR PROVIDING TRANSPARENT ORIGINALS FOR PRINTING PLATE PRODUCTION OR FOR DIRECT PRODUCTION OF PRINTING PLATE

FIELD OF THE INVENTION

The present invention relates in general to the production of transparent originals of the type used for preparation of a printing plate having a light sensitive layer for planographic printing, letter press printing or intaglio printing, and to the copying text and/or images directly onto a printing plate having a light sensitive layer. More specifically, the present invention relates to method and apparatus for the production of both positive and negative transparent originals containing text and pictures mixed with each other, text parts in various colors, pictures having negative text parts copied thereon, and the like.

BACKGROUND OF THE INVENTION

Conventional production of transparent originals for printing plates have previously been based on a layout. In accordance with conventional production techniques, a so-called "paste-up" is obtained by mounting the text on carriers considering the layout, and a collection film is made from the paste-up. On one or more collection films the picture reproductions are then mounted according to the layout. For multi-color printing, one film is provided for each color. The different part-colored pictures, or separations, of the same multi-color picture must be mounted extremely carefully so that the different part-color prints coincide with each other in the completed multi-color print. The collection film carrying the text should first be copied down to a film having a light sensitive material. In order to copy the pictures down to the same light sensitive film when working with positive text and pictures, a mask must be provided which has opaque parts instead of the pictures on a film. The picture mask is placed above the light sensitive film before the text is copied thereon, such that the parts of the light sensitive film which shall carry the pictures remain unexposed. The picture mask is thereafter removed, and a mask in which the sole transparent parts are the parts corresponding to the pictures is put on the light sensitive film which has already been exposed with the text, whereupon the pictures are exposed on the same time. After developing the light sensitive film, a transparent film is obtained which carries both text and pictures, and which film can be copied directly down to a printing plate which is prepared with a light sensitive layer.

The previously used method described above for the production of transparent originals or printing plates involves several disadvantages. A great degree of expert skill is necessary, for example, in order to get the different color separations of the same color picture in careful register with each other. Great care and expert skill are also necessary for the production of the necessary mask films for exposure of the pictures and text, respectively. Further, when color-separating color pictures, it is desireable to separate several pictures at the same time due to the time consuming and complicated nature of color-separation work. Therefore those several color pictures which may conveniently be separated at the same time are mounted on the same original base adjacent each other, and a number of color separation films are obtained, which mutually exactly coincide with each other and which may, considering their location on the color separation film, easily be brought to exact coincidence with each other by means of a register pin system or the like of a conventional color-separation camera. However, in the conventional production techniques described above, mounting of the color pictures according to the layout has required that the color separation films be cut into separate unit which are separately mounted on the collection film for pictures. It would be most advantageous to be able to use the color-separation films intact since not cutting them in pieces would eliminate the problems involved in mounting the color-separations exactly according to the layout, and in the mutual manual registering thereof by utilizing the exact mutual registration obtained in a color-separation camera or scanner. This advantage would obtain for whichever method is used for the copying, viz. a positive copying method or a negative copying method.

SUMMARY OF THE INVENTION

These and other disadvantages of the prior art are overcome by the methods of the present invention. In accordance with the present invention, a light sensitive collection surface is prepared for use directly or indirectly in printing copies on which text and images are arranged according to a predetermined layout in which areas are provided for the images, text portions may be printed in different colors, and images may have texts superimposed thereon, by first preparing a reproducible text on a first surface wherein the text is registered with respect to a correlating grid. A second surface is then prepared on which a plurality of reproducible images are arranged, each of the reproducible images having any desired size without any predetermined relationship to the size of the image areas provided in the layout, and the images being registered with respect to the correlating grid in any desired order without any predetermined relationship to the relative location of the image areas provided in the layout. The respective locations and sizes of the image areas provided in the layout area are then defined with at least two pairs of first position coordinates correlated to the correlating grid and the respective locations of the reproducible images are defined with at least one pair of second position coordinates correlated to the correlating grid. The collection surface is then exposed with the reproducible text from the first surface such that exposure of portions of the collection surface coresponding exclusively to the images and to any special text portions which are to be printed in a different color is prevented. The second surface is then positioned with respect to the collection surface by calculating the coordinate relationship between the corresponding ones of the first and second pairs of position coordinates so as to align at least one of the reproducible images with the unexposed area provided therefor on the collection surface. Finally, the at least one reproducible image is exposed onto the collection surface by lighting the at least one reproducible image ith a sharply defined light beam which is automatically sized in dependence on the corresponding pairs of the first position coordinates so as to fall within the area of the collection surface intended for the at least one reproducible image.

Further characteristics and objectives of the invention will be evident from the following detailed description, in which, for the sake of simplicity, the invention will be explained in connection with the production of transparent originals for a printing page having both text and pictures in several colors. It is, however, to be understood that the invention is not restricted to the method and the apparatus thus described or to the embodiments thereof shown in the drawings, but rather encompasses all modifications within the scope of the appended claims.

BRIEF DESCRIPTION OF THE DRAWINGS

FIG. 1 diagrammatically shows apparatus for use in practicing the present invention.

FIG. 2 shows an image film for use in practicing the present invention.

FIG. 4 diagrammatically shows in more detail a portion of the apparatus illustrated in FIG. 3.

DETAILED DESCRIPTION OF THE PREFERRED EMBODIMENTS

Referring now to FIG. 1 there is diagrammatically shown a mounting table 1 on which a layout 2 is mounted in a predetermined position. As is conventional, the layout includes text and images mixed up with each other, the image parts being denoted A, B, C and D. Spaced from layout 2, an image film 3 containing images A, B, C and D, is mounted by means of pins (not shown) on the mounting table which engage register holes 4 provided in film 3 for mounting thereof in a reproduction camera or scanner. With the aid of a conventional coordinate pattern two opposite corners of each layout image, e.g., the upper left and the lower right corners, are marked with two coordinates each so as to give the location and area for each image in the layout, and in the corresponding way but only for one point the intended coordinates are marked for the pictures of images A, B, C and D on the image film 3. Although the pictures on the image film are optionally placed thereon in any desired order, by a simple computation the coordinate relation for the images on image film 3 may be calculated so as to enable exact coincidence with the corresponding coordinates of the image parts of layout 2. The coordinates and the coordinate relations calculated in this way are used, as will be described in more detail hereinbelow, for adjusting each image of the image film in exact position in relation to the exposed text of the light sensitive collection film.

Figure 3:
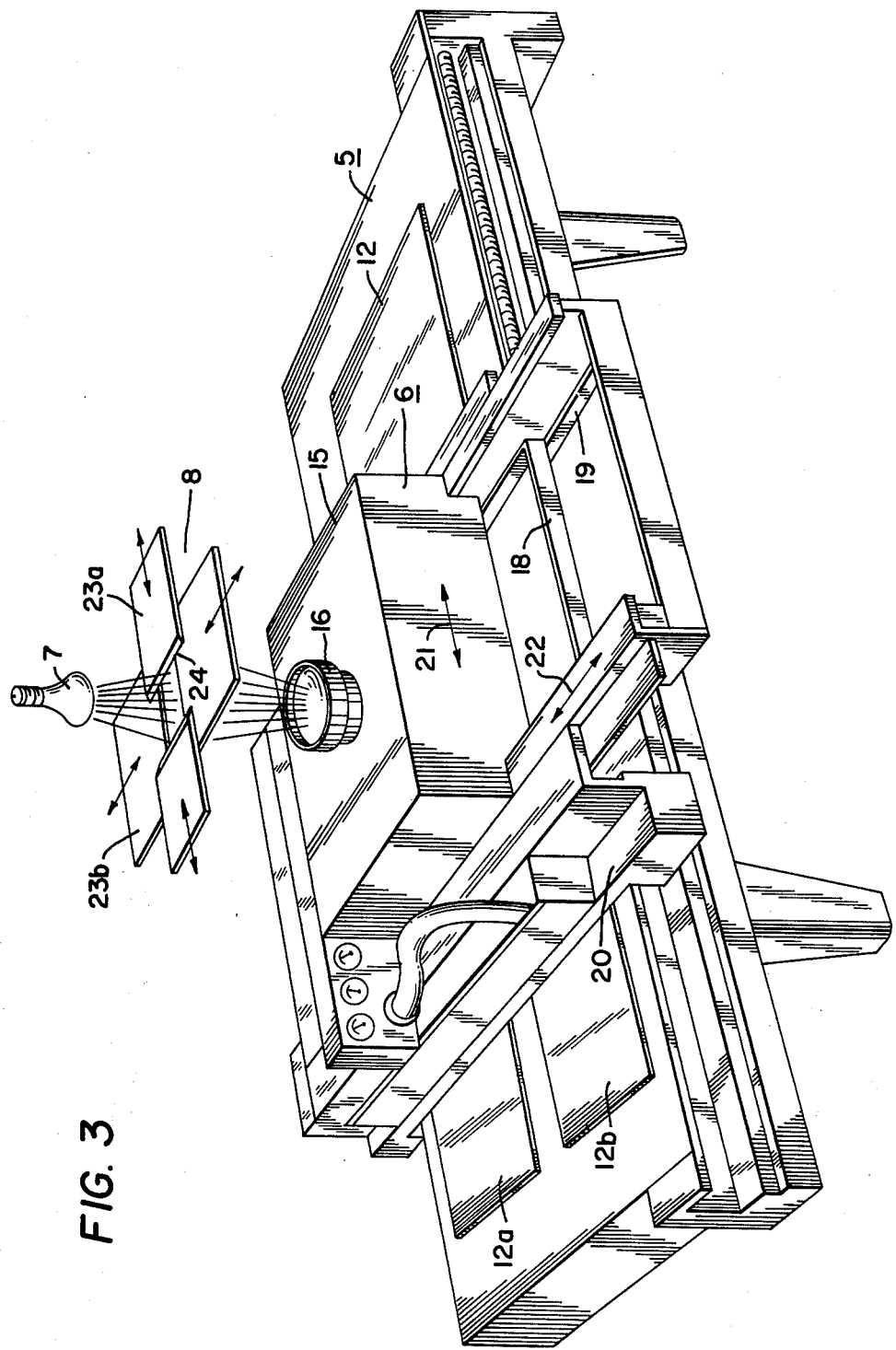
FIG. 3 shows in simplified form an embodiment of further apparatus constructed in accordance with the present invention.

When providing an original, e.g., a transparent film for the production of a printing plate, a copying machine of any suitable kind may be used, e.g., the one illustrated in FIG. 3. Such a machine comprises a copying table 5 on which a light sensitive film may be mounted, a copying frame 6 which is displaceable on the copying table in two directions perpendicular to each other, and a lighing means 7 having means 8 for providing a sharply defined lighting of any chosen area of the light sensitive film mounted on copying table 5.

Referring in particular to FIG. 4, copying frame 6 comprises a metal frame 9 which is movable vertically upwards and downwards and a glass plate 10 mounted at the underside of frame 9. A sealing rib 11 of rubber or similar material extends around glass plate 10 for making a vacuum suction possible which draws one or more text or image films 13 provided between a light sensitive film 12 mounted on copying table 5 and glass plate 10 into contact with film 12. The glass plate 10 is formed with grooves 14 extending thereabout for sucking one or more films 13 to glass plate 10.

Copying frame 6 is mounted in a box 15 above which there is a lens 16 for distributing the light from lighting means 7. In order to provide a vacuum for copying frame 6, the apparatus includes conventional vacuum means 17 which are mounted on copying frame 6.

In copying frame 6 there is also mounted a double film exchange magazine comprising two magazine boxes 18 and 19 which may alternately and optionally be brought to a position under copying frame 6 so that by moving frame 6 vertically upwards and downwards a film may be picked up or delivered from and to magazine 18 or 19, respectively.

Copying frame 6 is mounted on a carriage 20 which is movable to one direction or the other along the arrow 21, and copying frame 6 is itself movable to one direction or the other on carriage 20 along the direction denoted by arrow 22, which direction is perpendicular to the direction denoted by arrow 21.

The means 8 for providing a sharply defined lighting of the light sensitive film 12 mounted on copying table 5 comprises, as shown in FIG. 3, four masking plates 23 which are displaceable in two opposite directions independently of each other and which are actuated by means not shown in the drawings. Two plates 23a, which are opposed to each other, are movable in the direction of arrow 21, and the remaining two plates 23b, which are opposed to each other, are movable in the direction of arrow 22. Masking plates 23 are mounted in a specific position at a predetermined distance in relationship to lens 16, and lens 16 in turn is mounted in an exact position at a predetermined distance in relation to copying table 5, such that the sharp edges 24 of masking plates 23 form a very sharp and defined image of light on copying table 5. Preferrably edges 24 of masking plates 23 are beveled and plates 23 are mounted so that the sharp edges 24 of plates 23a are turned down and the sharp edges of plates 23b are turned up, i.e., so that the edges contact each other.

Figure 7:
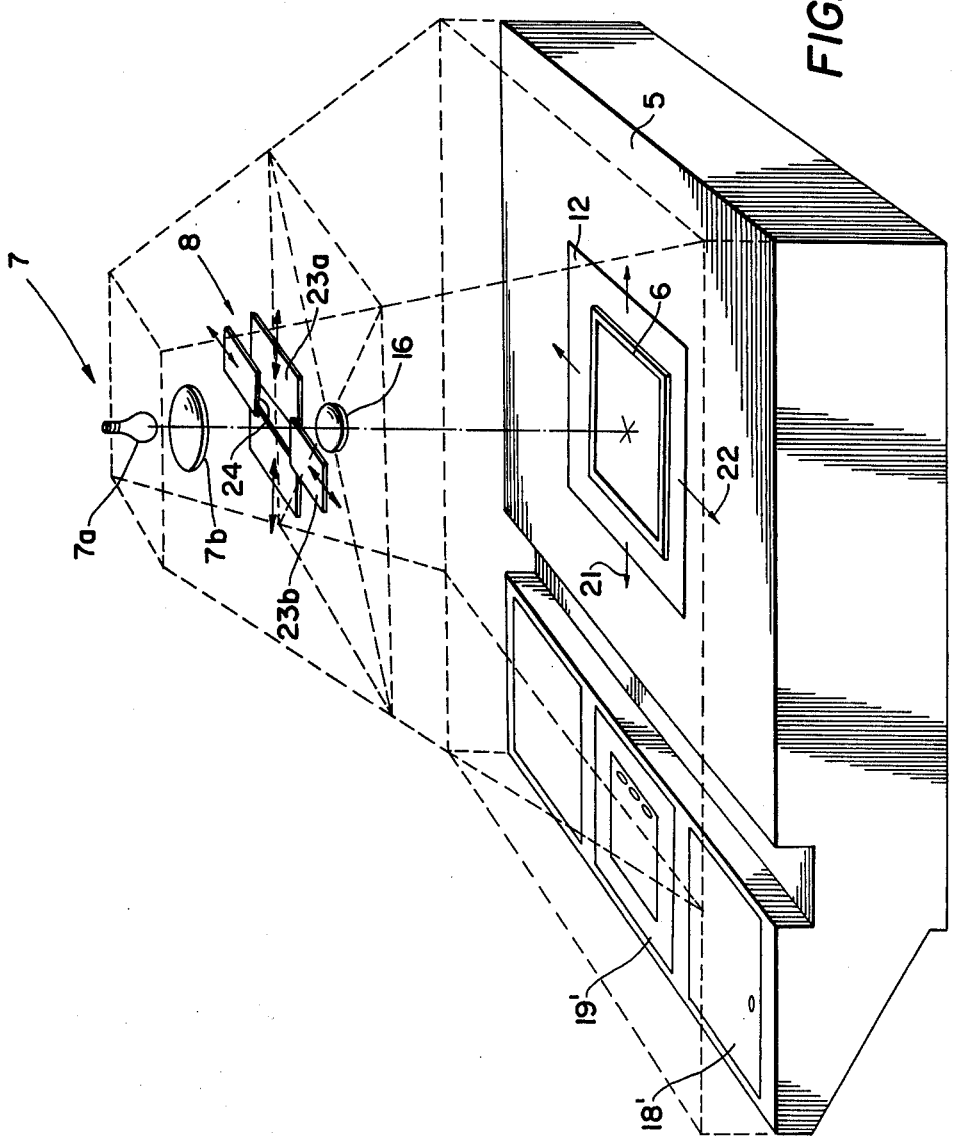
FIG. 7 diagrammatically shows another embodiment of the apparatus illustrated in FIG. 3, with portions thereof broken away from the figure for the sake of clarity.

The copying machine embodiment diagrammatically shown in FIG. 7 corresponds to all essential parts to the embodiment illustrated in FIG. 3, and thus comprises a copying table 5 on which a copying frame 6 is movable in two directions 21 and 22 perpendicular to each other. The lighting means includes a bulb 7a and a condenser lens 7b fixedly mounted in a housing 15. Masking plate means 8 are also mounted in housing 15 with the masking plates 23a movable in opposite directions along arrow 21 and the masking plates 23b movable in opposite directions along arrow 22. The exact position between light means 7, masking plates 8, lens 16 and copying frame 6 are calculated so that the sharp edges 24 of masking plates 23 produce a sharp image on a light sensitive film 12 placed under copying frame 6.

In the embodiment of the machine shown in FIG. 7, there are fixed magazines 18' and 19' with register pins for light sensitive films and originals to be copied respectively. There is a further magazine for used originals and exposed films. Copying frame 6 is movable within light sealed box 15 over copying table 5 and over magazines 18' and 19' so that it may pick up a film and /or or an original from magazine 18' or 19', respectively, or deliver a film or an original to the magazine for used originals or exposed films.

The machine shown in FIG. 7 is complimented by a conventional layout information and separation measuring digitizer from which all necessary information can be fed into a computer which will compile a list of all necessary masks, screens, film separations and texts in the correct order for the machine according to a given layout.

As will be described in more detail hereinbelow, the preparation of the printing original in accordance with the present invention may take place by copying either according to a positive or according to a negative method, i.e., copying by means of positive and negative text and image films, respectively.

For the sake of simplicity the negative copying method of the present invention will be described first, even though the positive method of the present invention may have more and greater advantages. As used herein, the negative copying method refers to copying of "negative" films, i.e., films in which the image carrying parts are transparent and the remaining parts are non-transparent. For this illustration of the invention it is presupposed that it is intended to provide a transparent printing plate original containing text and images as illustrated by layout 2 shown in FIG. 1.

For this purpose, a film containing text, and a film containing images, are made. The images may be placed optionally, without any particular predetermined location on the image film, and the image film generally may contain more images than the corresponding image parts on the text film. Both the text film and the image film have register holes 4 or the like, by means of which the text and image films may be mounted in an exact predetermined position, for instance, in one of the magazines 18 or 19 of the copying machine shown in FIG. 3, or in any other film support. If several print pages of the same layout are to be provided, they preferably have the same mutual position on the text films.

Referring to FIG. 1, before the copying begins the position of the image parts A, B, C and D are marked with the guidance of the layout 2 therefore by means of X and Y coordinates, e.g., for the corners 25 and 26, and in the same way at least an X coordinate and a Y coordinate is marked for each image on image film 27. With the aid of the coordinates thus marked an image on the image film may, by mean of priorly known mechanical means, easily be positioned in exact coincidence with the position of the image part in the layout and the text film.

Figure 5:
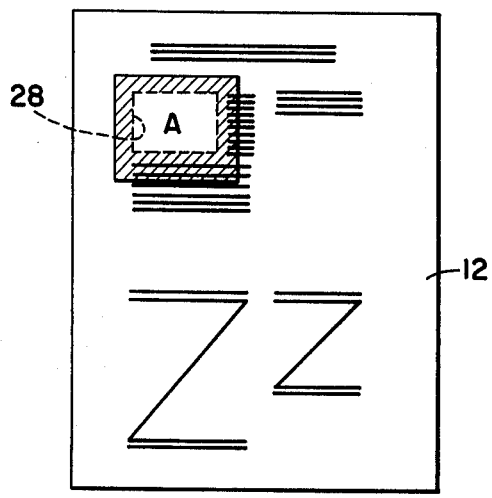
FIG. 5 illustrates an aspect of the present invention.
Figure 6:
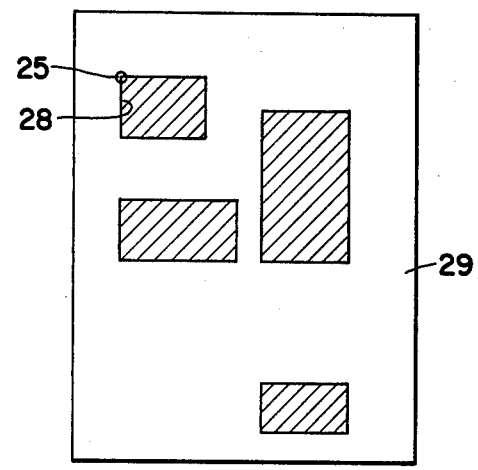
FIG. 6 shows an image mask prepared in accordance with the present invention.

Referring to FIG. 4, a light sensitive film 12, onto which text and image is to be copied, is then mounted on a substrate, e.g., copying table 5, and the text film is put into contact with light sensitive film 12. After lighting, a latent text is obtained on film 12, which is schematically illustrated in FIG. 5. When the text is copied, the text film is removed and the image film is positioned so that the location of an image, for example, image A, on the image film coincides with the given coordinates for the image of the light sensitive film. As illustrated in FIG. 5, the size of the image on the image film need not correspond to the size of the corresponding image part provided according to the layout. Thus, the area of the image A on the surface of film 12, as provided by a layout, is shown in FIG. 5 by the dotted lines 28, whereas the solid lines indicate the actual area of the image A on the image film. Since the image on the image film does not coincide with the intended image size, parts of the image will fall over the text which is already copied unless exposure to the overlapping parts of the image is prevented.

In priorly known methods, this is accomplished by copying the image through an image mask in which all parts outside the dotted image area are made non-transparent so that the image falls exactly within the intended area. According to the present invention it is possible to avoid the work involved in making such a mask by putting the image film into contact with light sensitive film 12 and lighting the image A on the image film with a sharply defined beam of light which exactly corresponds to the area within the dotted lines 28. This may be accomplished, e.g., with the copying machine shown in FIG. 3 by adjusting the masking plates 23 to obtain exact coincidence of the light beam with the image surface defined by lines 28, such that, during exposure, the beam of light will only fall exactly within the desired area of the image A. The images B, C and D are each in turn copied in the same manner onto the light sensitive film 12, and film 12 is subsequently developed and fixed in the usual way.

It is therefore possible in accordance with the present invention to reproduce any number of images without cutting down down the original for the images, without manually mounting same in exact coincidence with the intended surfaces therefore, without moutning the images in any particular predetermined locations on an image film, and without cutting out the separate images of the image film in order to copy the images onto one or several light sensitive films 12.

It is also to be noted that if suitable the images may of course be copied before the text.

The positive copying method of the present invention will now be described. As used herein this method refers to copying of "positive" films, i.e., films in which the image carrying parts are non-transparent and the non-image carrying parts are transparent.

When copying positive text and image films, one or more text films 13 and one or more image films 17 are prepared as described above. The positions 25 and 26 of the image parts provided in the layout and the correlation values between the coordinates of the layout and the coordinates of the location of each image on the image film 27 are marked.

In order to prevent the image surfaces 28 on the collection film 12 from being exposed when exposing the text it is necessary to provide a mask in which the areas corresponding to the image parts A, B, C and D are made non-transparent and the remaining surfaces of the mask are transparent. Such an image mask 29 is prepared in accordance with the present invention by mounting a light sensitive film on a copying table 5 and directing in turn sharply defined light beams corresponding to the image surfaces 28 onto the film, whereby the film is exposed in exact coincidence with the image parts A, B, C and D. Such a mask may also be made in the copying machine shown in FIG. 3 by adjusting the masking plates 23 considering the intended size of the image with the guidance of the marked coordinates therefor. A very accurate mask may thus be obtained with simple mechanical means.

Referring to FIG. 4, when copying the text onto the light sensitive collection film 12, the text film and the image mask 29 are put into exact concidence with each other and with film 12 using register holes of any other register means, and film 12 is exposed in the usual way.

The parts of image mask 29 which correspond to the images and which are non-transparent, e.g., the parts 29a and 29b depicted in FIG. 4, leave unexposed areas on the light sensitive film 12.

After text film 13 has been copied, the image film 27 is picked up and is adjusted and copied onto the light sensitive film 12 as described above by means of a sharply defined light beam corresponding to the actual size of the image part provided according to the layout.

It is to be noted that when providing the film with the other part colors, image mask 26 is first used to expose the non-image carrying surfaces. Thereafter, each color separated image is copied as described above.

By lighting a light sensitive film with a sharply defined light beam as described above, it is possible to prepare an image mask in a simple way and to cut or define the image surface in the act of copying, and to use the image film 27 without cutting it into separate image films, and in this way the time consuming and complicated mounting work that was previously required in conventional methods is eliminated. The method is especially advantageous in the preparation of originals having multi-color pictures, since the images on each part-color separation have exactly the same location on each image film and therefore no further markings, measuring or manual steps are necessary. The different part color separation films are copied in turn with exactly the same adjustment of a sharply defined light beam.

In a modified method according to the invention, the image films of a part color separations may be copied in the same step by mounting several light sensitive films on the copying table, e.g., the films 12a and 12b of FIG. 3, and by copying each part-color separation separately with a predetermined and precalculated displacement of the copying frame and the masking plates.

It is also possible, using the method of the present invention, to provide text of several colors, such as, for example, having headlines or some other portions of the text printed in another color from the remainder of the text, using the same text film 13. This is simply accomplished by providing a mask corresponding to the text to be separated and subsequently lighting only the separated text of the film corresponding to the intended color to be printed. In a similar manner, it is possible to provide any varied forms of the image with the aid of manually provided masks of any particular shape, e.g., round, eliptical or any other form and subsequently lighting an area corresponding to the greatest length and width respectively of the particular mask, which does not effect the text or the remaining images.

By utilizing the method according to the invention, it is also possible to copy light (negative) texts superimposed on an image, viz. by providing the text in the image mask.

The invention also relates to apparatus, as shown in FIG. 7, for executing the method according to the invention, which apparatus comprises a copying frame 6 which is displaceable in two directions 21 and 22 perpendicular to each other over a substrate, such as copying table 5. Above the frame there is a lens 16 through which a light beam from a lighting means 7 may be thrown onto the copying frame. At a predetermined distance above the lens there is a system of masking plates 23, two of which, plates 23a, are movable independently of each other in a direction parallel to one of the directions, as denoted by arrow 21, in which copying frame 6 is movable, and two others of which, masking plates 23b, are movable independently of each other in a direction which is perpendicular thereto. Preferrably the masking plates 23a and 23b each are actuated by an electric motor (not shown) by means of which the plates may be moved to an exact predetermined position considering the intended location of each respective image.

Suitably copying frame 6 is vertically movable and is formed with means for vacuum sucking one or several films, e.g., an image mask 29 and a text film 13, and the apparatus may be provided with two or more magazines 18 and 19 for text films, image films and masks. In order to provide the sharply defined light beam on a light sensitive film mounted on the copying table, the distance between the film 12 and lens 16 on the one hand, and between lens 16 and sharp edges 24 of masking plate 23 on the other hand, are calculated considering the focus distance of lens 16, whereby the sharp edges of the masking plate give a sharp image on light sensitive film 12.

It is of minor importance to the invention how the text is provided on a light sensitive collection film, and this can be accomplished either by providing the text of a transparent text film or as a reproduction proof on paper, or as a photocomposition on papered strips of filmed strips, in which cases the text may be projected onto the light sensitive collection film with the aid of an inclined mirror mounted above lens 16, or in any other suitable way. The pictures may be provided as photo reproductions of the original picture for one or more colors.

Further, by putting the images and the particular text parts which are to be printed in a different color on the image film in predetermined positions considering the layout and in register utilizing the register holes in the image film or the like, the time consuming and complicated work entailed in the prior methods of mounting images on a separate collection film is avoided. In addition, the method of the present invention allows a great number of images corresponding to several of the pages of printed matter to be made to be provided at the same time, on the same film, for reproducing or color separating several color pictures. Still further, by also exposing the particular text parts or images on the image film with sharply defined light source which exactly falls within the areas of the light sensitive collection film intended therefor, the images on the image film no longer need be dimensioned in correspondence to the intended areas on the light sensitive collection film.

What we claim is:

1. A method for the preparation of a transparent original containing both text and images for use in the production of printing forms and plates comprising the steps of preparing a reproducible text on a surface wherein the text is arranged according to a predetermined layout in which areas are provided for the images and the layout is registered with respect to a correlating grid, preparing a unitary image film containing a plurality of images thereon, each of said images having any desired size without any predetermined relationship to the size of the image areas provided in the layout and said images being arranged in any desired order without any predetermined relationship to the relative locations of the image areas provided in the layout and registered with respect to said correlating grid, defining the respective locations and sizes of said areas with at least two pairs of first position coordinates correlated to said correlating grid and defining the respective locations of said images with at least one pair of second position coordinates correlated to said correlating grid, exposing a light sensitive collection film wih the reproducible text such that exposure of portions of said collection film corresponding exclusively to the images and to any special text parts which are to be printed in a different color is prevented, automatically positioning the image film with respect to the collection film by calculating the coordinate relationship between the corresponding ones of said first and second pairs of position coordinates so as to align at least one of the images with the unexposed area provided therefor on the collection film, exposing the at least one image onto the collection film by lighting the at least one image with a sharply defined light beam which is automatically sized in dependence on the corresponding pairs of said first position coordinates so as to fall within the area of the collection film intended for the at least one image.

2. The method of claim 1 wherein the sharply defined light beam is accomplished by means of a light source, four masking plates which are moveable in directions perpendicular to each other, and a lens which is positioned so as to provide a focused light beam which impinges on the collection film with sharply defined edges.

3. The method of claim 1 wherein the at least one image may be larger than the area intended therefor on the collection film and only a portion of the at least one image is exposed onto the collection film by shading the sharply defined light beam to fall within the area of the collection film.

4. The method of claim 1 wherein the image film is positioned by movement in at least one of two directions which are perpendicular to each other and which correspond to the axes of the correlating grid, and the exposing of the at least one image onto the collection film includes the step of positioning the light beam by displacement in at least one of two directions which are perpendicular to each other and which correspond to the axes of the correlating grid.

5. The method of claim 1 further comprising the steps of preparing an image mask by exposing a light sensitive image mask film with a sharply defined light beam such that areas of the image mask film corresponding to the areas image provided on the text surface are exposed, and positioning the image mask in registry with the collection film prior to the step of exposing the collection film with the text film.

6. A method for the preparation of a light sensitive collective surface for use directly or indirectly in printing copies on which text and images are arranged according to a predetermined layout in which areas are provided for the images, text portions may be printed in different colors, and images may have text superimposed thereon, the method comprising the steps of:

preparing a reproducible text on a first surface wherein the text is registered with respect to a correlating grid;

preparing a second surface on which a plurality of reprocible images are arranged, each of said reproducible images having any desired size without any predetermined relationship to the size of the image areas provided in the layout and said images being registered with respect to said correlating grid in any desired order without any predetermined relationship to the relative locations of the image areas provided in the layout defining the respective locations and sizes of said image areas provided in the layout with at least two pairs of first position coordinates correlated to said correlating grid and defining the respective locations of said reproducible images with at least one pair of second position coordinates correlated to said correlating grid;

exposing the collection surface with the reproducible text from said first surface such that exposure of portions of the collection surface corresponding exclusively to the images and to any special text portions which are to be printed in a different color is prevented;

positioning said second surface with respect to the collection surface by calculating the coordinate relationship between the corresponding ones of said first and second pairs of position coordinates so as to align at least one of said reproducible images with the unexposed area provided therefor on the collection surface; and exposing said at least one reproducible image onto the collection surface by lighting said at least one reproducible image with a sharply defined light beam which is automatically sized in dependence on the corresponding pairs of said first position coordinates so as to fall within the area of the collection surface intended for said at least one reproducible image.

* * * * *